United States Patent [19]

Jinbo

[11] Patent Number: 5,276,371
[45] Date of Patent: Jan. 4, 1994

[54] OUTPUT BUFFER HAVING HIGH RESISTANCE AGAINST ELECTROSTATIC BREAKDOWN

[75] Inventor: Toshikatsu Jinbo, Tokyo, Japan

[73] Assignee: NEC Corporation, Tokyo, Japan

[21] Appl. No.: 868,443

[22] Filed: Apr. 14, 1992

[30] Foreign Application Priority Data

May 2, 1991 [JP] Japan ............... 3-130550

[51] Int. Cl.$^5$ ............................. H03K 17/687
[52] U.S. Cl. ............................ 307/572; 307/585
[58] Field of Search ............... 307/448, 457, 469, 571, 307/304, 585

[56] References Cited

U.S. PATENT DOCUMENTS

| | | | |
|---|---|---|---|
| 4,647,798 | 3/1987 | Crafts et al. | 307/304 |
| 4,733,111 | 3/1988 | Fassino et al. | 307/585 |
| 4,958,091 | 9/1990 | Roberts | 307/571 |

Primary Examiner—Jin F. Ng
Assistant Examiner—Sinh Tran
Attorney, Agent, or Firm—Laff, Whitesel, Conte & Saret

[57] ABSTRACT

An output buffer has a series circuit connected between a first and a second power supply terminal, which circuit is formed by a first n-channel MOSFET whose gate receives a first output data control signal and a second n-channel MOSFET whose gate receives a second output data control signal. The output buffer further has a third N-channel MOSFET connected between a bonding pad and a common junction node defined by the first and second N-channel MOSFETs. The third N-channel MOSFET has a gate connected to the first power supply terminal so that it is controlled to be always in a conductive state. The output buffer is effectively increased or enhanced in its resistance against electrostatic breakdown.

2 Claims, 3 Drawing Sheets

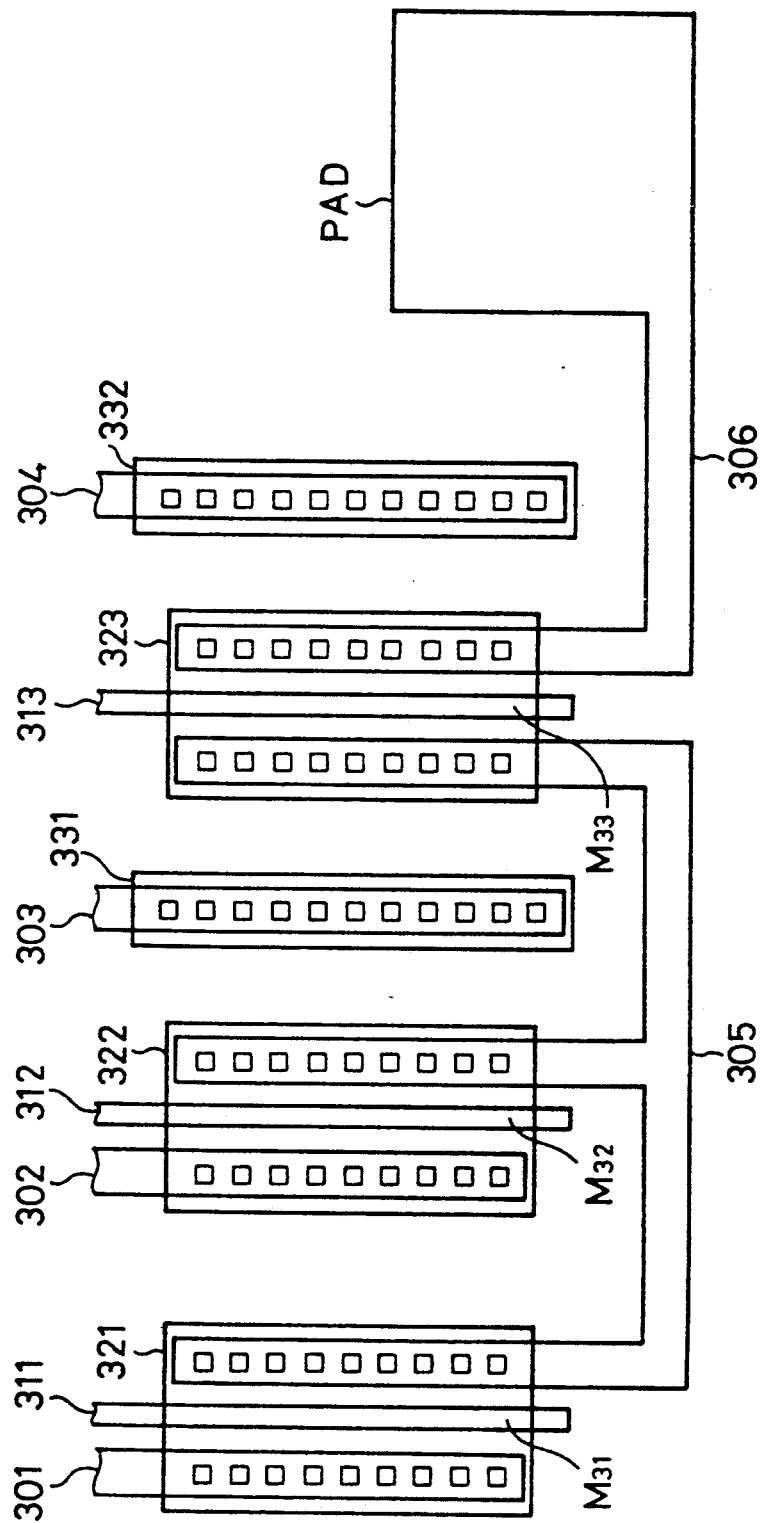

OUTPUT BUFFER HAVING HIGH RESISTANCE AGAINST ELECTROSTATIC BREAKDOWN

BACKGROUND OF THE INVENTION

1. Field of the Invention

The present invention relates to an output buffer in a semiconductor integrated circuit device, and more particularly to an output buffer in which resistance against electrostatic breakdown is enhanced or improved.

2. Description of the Related Art

A conventional output buffer of the kind to which the present invention relates is shown in FIG. 1A. The conventional output buffer has a series circuit connected between a power supply terminal $V_{CC}$ and a ground terminal $V_{SS}$, which is formed by an n-channel MOS field effect transistor (hereinafter referred to as "MOSFET") M11 receiving at its gate a first output data control signal D11 and an n-channel MOSFET 712 receiving at its gate a second output data control signal D12. A common junction node X1 defined between these two n-channel MOSFETs M11 and M12 is connected to a bonding pad PAD which is connected with an output terminal of the semiconductor integrated circuit device.

Next, the operation of the above described output buffer will be explained.

When the first output data control signal D11 is at a high level and the second output data control signal D12 is at a low level, the n-channel MOSFET M11 turns to a conductive state and the n-channel MOSFET M12 turns to a non-conductive state, so that the data outputted by the n-channel MOSFET M11 becomes a high level. On the contrary, when the first output data control signal D11 is at a low level and the second output data control signal D12 is at a high level, the n-channel MOSFET M11 turns to its non-conductive state and the n-channel MOSFET M12 turns to its conductive state, so that the data outputted by the n-channel MOSFET M12 becomes a low level.

However, in semiconductor integrated circuit devices for which minitualization is being advanced, to prevent degradation by the hot carrier in the element, the devices are being formed with a lightly doped drain (LDD) structure. In other words, in this type of MOSFETs, as shown in FIG. 2, a gate electrode 203 is formed on a p-type semiconductor substrate 201 with a gate silicon dioxide layer 202 being disposed therebetween, and there are formed at both sides of the gate electrode 203 a drain region constituted by an n+-diffusion layer 204 and an n⁻-diffusion layer 205, and a source region constituted by an n+-diffusion layer 206 and an n⁻-diffusion layer 207.

The above mentioned conventional output buffer had a disadvantage in that, because it was made with the LDD structure MOSFETs, its resistance against electrostatic breakdown was insufficient.

In an LDD structure MOSFET as shown in FIG. 2, if a high voltage is applied to the drain thereof, avalanche breakdown occurs in the vicinity of the gate electrode of the drain electrode, that is, at the n⁻-diffusion layer 205, and holes are injected into the p-type semiconductor substrate 201. As a result, the potential of the semiconductor substrate 201 rises, the region between the source region (n+-diffusion layer 206 and n⁻-diffusion layer 207) and the semiconductor substrate 201 becomes biased in the forward direction, and electrons are injected into the substrate 201 from the source region. As a result, the MOSFET operates in a state near negative-resistance and excessive current flows in the n⁻-diffusion layer 205 forming the drain region, and this drain region is destroyed by heat due to the high resistance value of this diffusion layer.

To cope with this, as shown in FIG. 1B, there is a method in which a resistor element R is connected between the junction node X1 of the MOSFETs M11, M12 and the bonding PAD to enhance the resistance against electrostatic breakdown, but to attain the required resistance against the electrostatic breakdown, a resistor having a high resistance value must be used, and in this case, the current drivability of the output buffer is reduced, and the lowering of the operation speed becomes a problem.

SUMMARY OF THE INVENTION

It is, therefore, an object of the invention to overcome the problems existing in the conventional ones and to provide an improved output buffer in which the resistance against electrostatic breakdown is increased.

According to one aspect of the present invention, there is provided an output buffer which comprises:
a first and a second power supply source;
a first MOSFET in which a gate receives a first output data control signal, either one of a source and a drain is connected to the first power supply source, and the other one of the source and drain is connected to a common junction node;
a second MOSFET in which a gate receives a second output data control signal, either one of a source and a drain is connected to the second power supply source, and the other one of the source and drain is connected to the common junction node; and
a third MOSFET which is controlled to be always in a conductive state and in which either one of a source and a drain is connected to the common junction node and the other one of the source and drain is connected to a data output terminal.

BRIEF DESCRIPTION OF THE DRAWINGS

The above and other objects, features and advantages of the present invention will be apparent from the following description of preferred embodiments of the invention explained with reference to the accompanying drawings, in which:

FIG. 4 is a plane view showing the arrangement of the first embodiment of the invention, on the semiconductor substrate.

PREFERRED EMBODIMENTS OF THE INVENTION

Next, embodiments of this invention will be explained with reference to the attached drawings.

Figure 1A:
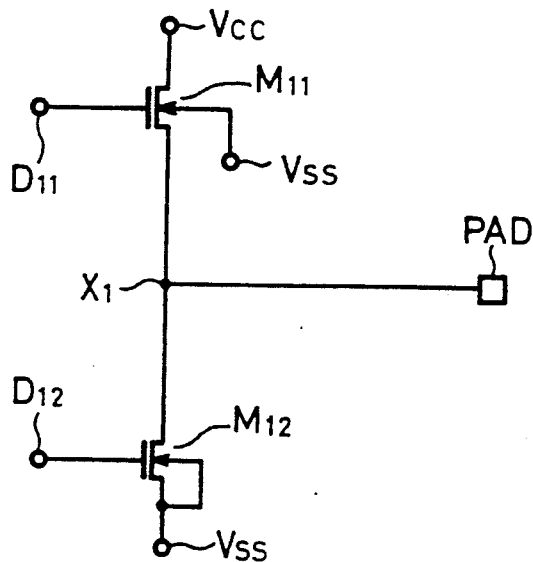
FIG. 1A is a circuit diagram of a typical conventional output buffer.
Figure 1B:
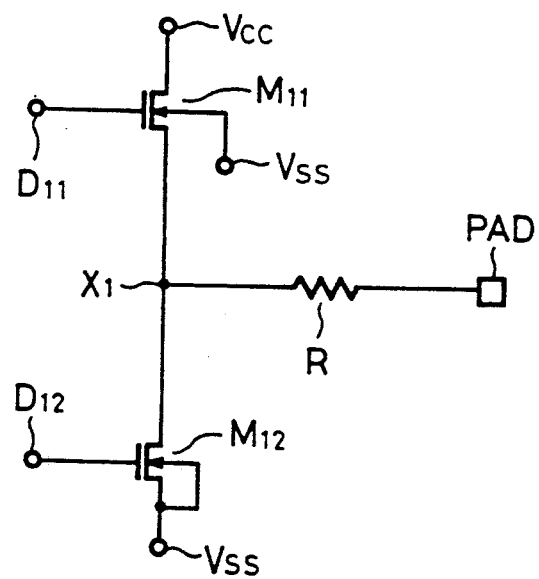
FIG. 1B is a circuit diagram of a conventional output buffer having a series output resistor to enhance resistance against electrostatic breakdown.
Figure 2:
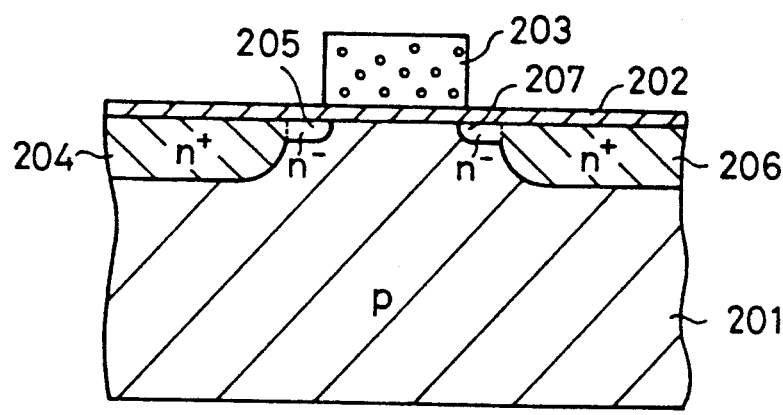
FIG. 2 is a sectional view of a MOSFET having a lightly doped drain structure.
Figure 3:
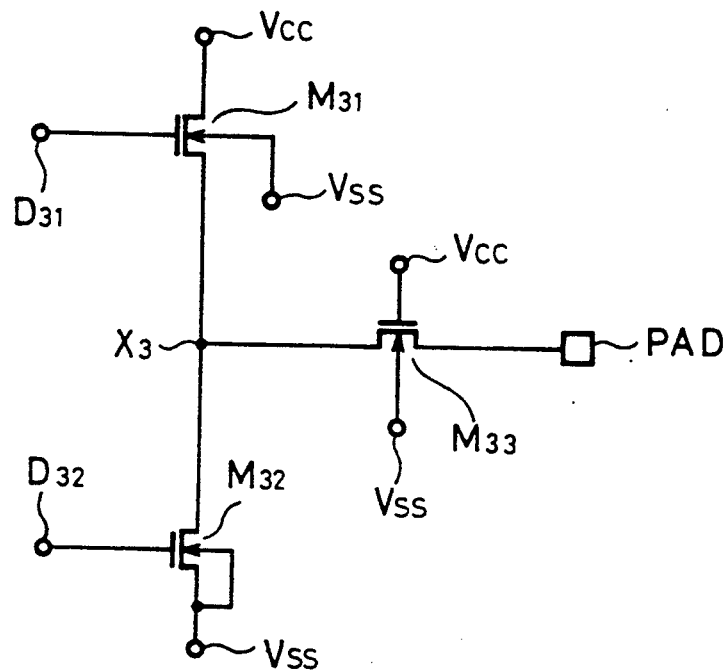
FIG. 3 is a circuit diagram of an output buffer of a first embodiment according to the invention.

FIG. 3 is a circuit diagram of an output buffer of a first embodiment according to the invention. As shown in the drawings, a series circuit consisting of a first n-channel MOSFET M31 whose gate receives a first output data control signal D31, and a second MOSFET M32 whose gate receives a second output data control signal D32 is connected between the power supply terminal $V_{CC}$ and the ground terminal $V_{SS}$, and a junction node X3 at which both the first n-channel MOSFET M31 and the second n-channel MOSFET M32 are commonly connected is coupled, through a third n-channel MOSFET M33 whose gate is connected to the power supply terminal $V_{CC}$, to the bonding pad PAD to which the data output terminal of the semiconductor device is connected.

Next, the operation of this output buffer will be explained.

When the first output data control signal D31 is at a high level and the second output data control signal D32 is at a low level, the first n-channel MOSFET M31 becomes conductive and the second n-channel MOSFET M32 becomes non-conductive. Because the third n-channel MOSFET M33 is in its conductive state as the power supply voltage $V_{CC}$ is applied to its gate, the bonding pad PAD is connected to the power supply terminal $V_{CC}$ through the first n-channel MOSFET M31 and the third n-channel MOSFET M33, whereby the output data becomes a high level.

Contrary to the above, when the first output data control signal D31 is at a low level and the second output data control signal D32 is at a high level, the first n-channel MOSFET M31 becomes non-conductive and the second n-channel MOSFET M32 becomes conductive and, because the third n-channel MOSFET M33 is in the conductive state with the power supply voltage $V_{CC}$ being applied to its gate, the bonding pad PAD is connected through the second n-channel MOSFET M32 and the third n-channel MOSFET M33 to the ground terminal $V_{SS}$, whereby the output data becomes a low level.

FIG. 4 is a plane view showing the arrangement on the semiconductor substrate, according to this embodiment.

The first n-channel MOSFET M31, shown in FIG. 3, is composed of a first n-diffusion layer 321 and a gate electrode 311; the second n-channel MOSFET M32 is composed of an n-diffusion layer 322 and a gate electrode 312; and the third n-channel MOSFET M33 is composed of an n-diffusion layer 323 and a gate electrode 313.

The n-diffusion layers (321, 322, 323) of one side of each of the n-channel MOSFETs M31, M32 and M33 are connected commonly by the metal wiring layer 305, and the bonding pad PAD is connected to the other side of the n-diffusion layer 323 of the third n-channel MOSFET M33 by the metal wiring layer 306.

The n-diffusion layers 321 and 322 on the other sides of the n-channel MOSFETs M31 and M32 are connected to the $V_{CC}$ power supply wiring layer 301 and the $V_{SS}$ power supply wiring layer 302, respectively.

Furthermore, p-diffusion layers 331 and 332 are provided in the vicinity of the third n-channel MOSFET M33, and by connecting them to the $V_{SS}$ power supply wiring layers 303 and 304, respectively, a ground potential is applied to the substrate.

Here, it is assumed that a high voltage noise such as an electrostatic noise is inputted to the bonding pad PAD from outside the semiconductor device, the high voltage noise is applied to the one side of the diffusion layer of the third n-channel MOSFET M33 to which side the metal wiring layer 306 is connected, and avalanche breakdown occurs in this diffusion layer.

However, since the other side of the n-diffusion layer 323 of the third n-channel MOSFET M33 is not directly grounded to the ground potential and is grounded through the second n-channel MOSFET M32, the injection of the electrons is suppressed by the impedance of this MOS transistor, and the destruction by heat of the n⁻-diffusion layer which is a component of the n-diffusion layer 323, is effectively prevented.

Also, because the n-diffusion layer 323 which is connected to the bonding pad is arranged widely separated from the n-diffusion layer 322 which is connected to the power supply source $V_{SS}$, and further the p-diffusion layers 331, 332 of the ground potential are arranged in the vicinity of the third n-channel MOSFET M33, even if avalanche breakdown occurs in the n-diffusion layer 323 of the third n-channel MOSFET M33, the injection holes are absorbed in the p-diffusion layers 331 and 332 and thus a rise in the substrate potential in the vicinity of the n-diffusion layer 322 connected to the power supply source $V_{SS}$ is not large. Thus, the n-diffusion layer 322 connected to the $V_{SS}$ power supply source is not biased in the forward direction, and the flow of excessive current in the second n-channel MOSFET M32 is effectively prevented.

As described hereinabove, according to this embodiment, the resistance against electrostatic breakdown of the output buffer can be greatly increased or enhanced.

In this embodiment, since the third MOSFET M33 is connected between the common junction node X3 of the MOSFETs M31, M32 and the bonding pad PAD, the circuit results in one in which an impedance is inserted into the output circuit. However, because the gate of the third n-channel MOSFET M33 is connected to the power supply source $V_{CC}$ thereby rendering this MOSFET M33 always to be conductive, any significant drop in the current drivability of the output buffer can be prevented by properly setting the gate length and the gate width of this MOSFET.

Figure 5:
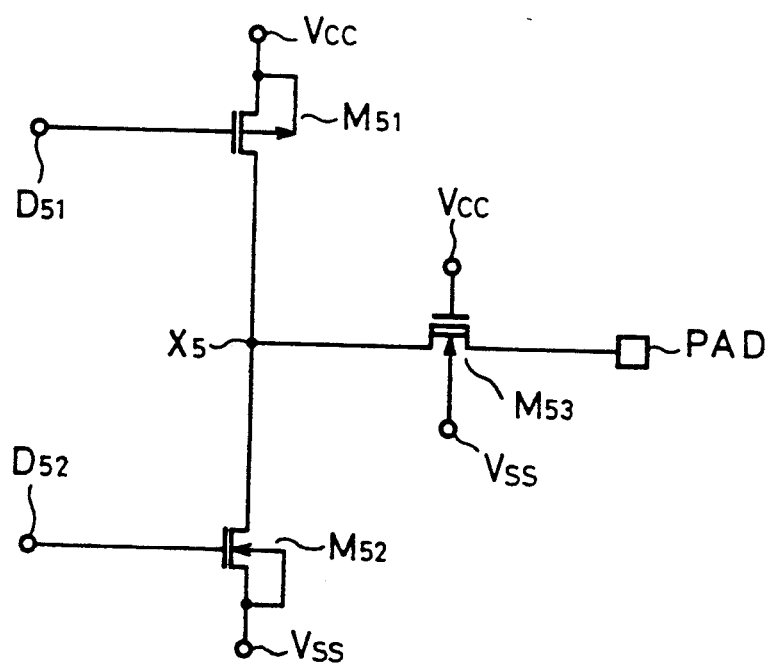
FIG. 5 is a circuit diagram of an output buffer of a second embodiment according to the invention.

FIG. 5 is a circuit diagram of an output buffer of a second embodiment according to the invention. In this embodiment, a series circuit consisting of a p-channel MOSFET M51 whose gate receives a first output data control signal D51 and an n-channel MOSFET M52 whose gate receives a second output data control signal D52 is connected between the power supply terminal $V_{CC}$ and the ground terminal $V_{SS}$, and the junction node X5 between the p-channel MOSFET M51 and the n-channel MOSFET M52 is connected through an n-channel depletion mode MOSFET M53 whose gate receives the power supply voltage $V_{CC}$, to the bonding pad PAD which is connected to the data output terminal of the semiconductor integrated circuit device.

Next, the operation of the output buffer of this second embodiment is explained.

When both the first and the second output data control signals D51 and D52 are low level, the p-channel MOSFET M51 becomes a conductive state and the n-channel MOSFET M52 becomes a non-conductive state and, since the n-channel depletion mode MOSFET M53 is in its conductive state, the bonding pad PAD is connected to the power supply source terminal $V_{CC}$ through the p-channel MOSFET M51 and the n-channel depletion mode MOSFET M53, whereby the output data becomes a high level.

On the contrary, when both the first and the second output data control signals D51 and D52 are high level, the p-channel MOSFET M51 becomes a non-conductive state and the n-channel MOSFET M52 becomes a conductive state and, since the n-channel depletion mode MOSFET M53 is in its conductive state, the bonding pad PAD is connected through the n-channel MOSFET M52 and the n-channel depletion mode MOSFET M53 to the ground terminal $V_{SS}$, whereby the output data becomes a low level.

According to the above second embodiment, the same effect as achieved by the first embodiment can also be achieved by the arrangement wherein the MOSFET M53 is connected between the bonding PAD and the common junction node of the MOSFETs M51, M52. This second embodiment has an advantage in that, when the high level output is outputted, the level thereof can be made equal to the power supply source voltage $V_{CC}$ because the bonding pad PAD is connected to the power supply source $V_{CC}$ through the p-channel MOSFET M51 and the n-channel depletion mode MOSFET M53.

As has been explained hereinabove, according to the arrangement of the invention wherein the first MOSFET whose gate receives the first output data control signal and the second MOSFET whose gate receives the second output data control signal are connected in series between the first power supply source and the second power supply source, and the common junction node of the first and second MOSFETs is connected to the data output terminal through the third MOSFET, because the third MOSFET is connected through the second MOSFET to the second power supply source, the flow of excessive current in the third MOSFET is prevented by the impedance of the second MOSFET even if a high voltage noise such as an electrostatic noise is applied to the data output terminal. Also, because the diffusion layer connected to the second power supply source is isolated from the diffusion layer connected to the data output terminal, even if a high voltage noise is inputted to the data output terminal thereby injecting holes from the diffusion layer to the substrate, there is no greater rise in the potential of the diffusion layer connected to the second power supply source, whereby the electrostatic breakdown of the second MOSFET is effectively prevented.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. An output buffer of a semiconductor integrated circuit device comprising
    a first power supply source having a high potential;
    a second power supply source having a low potential;
    a first MOSFET in which a gate receives a first output data control signal, either one of a source and a drain being connected to said first power supply source, and the other one of said source and drain being connected to a common junction node;
    a second MOSFET in which a gate receives a second output data control signal, either one of a source and a drain being connected to said second power supply source, and the other one of said source and drain being connected to said common junction node;
    a third MOSFET which is controlled to always be in a conductive state and in which either one of a source and a drain is connected to said common junction node and the other one of said source and drain is connected to an external data output terminal of the semiconductor integrated circuit device;
    said third MOSFET having first diffusion layers formed on a semeconductor substrate, said first diffusion layers being respectively a source region and a drain region, and second diffusion layers connected to said second power supply source, said second diffusion layers having a conductivity type which is opposite to the conductivity type of said first diffusion layers of said third MOSFET;
    said first MOSFET being a p-channel type, said second MOSFET being an n-channel type, and said third MOSFET being an n-channel depletion type, said first MOSFET having a source connected to said first power supply source and a drain connected to said common junction node, said second MOSFET having a source connected to said second power supply source and a drain connected to said common junction node, and said third MOSFET having a drain connected to said common junction node, a gate connected to said first power supply source and a source connected to said external data output terminal of the semiconductor integrated circuit device.

2. An output buffer circuit of a semiconductor integrated circuit device, said buffer circuit comprising:
    a first and a second power supply source having a high potential and a low potential, respectively;
    a first MOSFET in which a gate receives a first output data control signal, either one of a source and a drain being connected to said first power supply source, and the other one of said source and drain being connected to a common junction node;
    a second MOSFET in which a gate receives a second output data control signal, either one of a source and a drain being connected to said second power supply source, and the other one of said source and drain being connected to said common junction node;
    a third MOSFET which is controlled to always be in a conductive state and in which either one of a source and a drain is connected to said common junction node and the other one of said source and drain is connected to a data output terminal;
    said third MOSFET having first diffusion layers formed on a semiconductor substrate, said first diffusion layers being respectively a source region and a drain region, and second diffusion layers connected to said second power supply source, said second diffusion layers having a conductivity type which is opposite to the conductivity type of said first diffusion layers of said third MOSFET.

* * * * *